(12) United States Patent
Philippou et al.

(10) Patent No.: US 10,424,645 B2
(45) Date of Patent: Sep. 24, 2019

(54) SEMICONDUCTOR DEVICE, METHOD FOR TESTING A SEMICONDUCTOR DEVICE AND METHOD FOR FORMING A SEMICONDUCTOR DEVICE

(71) Applicant: Infineon Technologies AG, Neubiberg (DE)

(72) Inventors: Alexander Philippou, Munich (DE); Erich Griebl, Dorfen (DE); Johannes Georg Laven, Taufkirchen (DE); Maria Cotorogea, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 34 days.

(21) Appl. No.: 15/657,735

(22) Filed: Jul. 24, 2017

(65) Prior Publication Data

US 2018/0033705 A1 Feb. 1, 2018

(30) Foreign Application Priority Data

Jul. 27, 2016 (DE) .................. 10 2016 113 837

(51) Int. Cl.
*H01L 23/58* (2006.01)
*H01L 21/66* (2006.01)
(Continued)

(52) U.S. Cl.
CPC .......... *H01L 29/407* (2013.01); *G01R 31/025* (2013.01); *G01R 31/2644* (2013.01);
(Continued)

(58) Field of Classification Search
CPC ............ H01L 22/32; H01L 21/823475; H01L 23/5221; H01L 22/14; H01L 29/407;
(Continued)

(56) References Cited

U.S. PATENT DOCUMENTS

| 6,359,306 B1* | 3/2002 | Ninomiya | ........... H01L 29/7825 257/328 |
| 7,679,136 B2* | 3/2010 | Kachi | ............... H01L 29/66727 257/330 |

(Continued)

FOREIGN PATENT DOCUMENTS

| CN | 1819199 A | 8/2006 |
| CN | 101107700 A | 1/2008 |

(Continued)

*Primary Examiner* — Shouxiang Hu
(74) *Attorney, Agent, or Firm* — Murphy, Bilak & Homiller, PLLC

(57) ABSTRACT

A semiconductor device includes a first source wiring substructure connected to a plurality of source doping region portions of a transistor structure, and a second source wiring substructure connected to a plurality of source field electrodes located in a plurality of source field trenches extending into a semiconductor substrate. A contact wiring portion of the first source wiring substructure and a contact wiring portion of the second source wiring substructure are located in a wiring layer of a layer stack located on the semiconductor substrate. The contact wiring portion of the first source wiring substructure and the contact wiring portion of the second source wiring substructure each have a lateral size sufficient for a contact for at least a temporary test measurement. The wiring layer including the contact wiring portions is located closer to the substrate than any ohmic electrical connection between the first and the second source wiring substructures.

19 Claims, 10 Drawing Sheets

(51) Int. Cl.
| | |
|---|---|
| *H01L 29/40* | (2006.01) |
| *H01L 29/66* | (2006.01) |
| *H01L 21/786* | (2006.01) |
| *H01L 29/417* | (2006.01) |
| *H01L 21/8234* | (2006.01) |
| *G01R 31/02* | (2006.01) |
| *G01R 31/26* | (2014.01) |
| *H01L 23/522* | (2006.01) |
| *H01L 29/739* | (2006.01) |
| *H01L 29/78* | (2006.01) |

(52) U.S. Cl.
CPC .... *H01L 21/786* (2013.01); *H01L 21/823418* (2013.01); *H01L 21/823475* (2013.01); *H01L 22/14* (2013.01); *H01L 22/32* (2013.01); *H01L 22/34* (2013.01); *H01L 23/5221* (2013.01); *H01L 29/41766* (2013.01); *H01L 29/66727* (2013.01); *H01L 29/7397* (2013.01); *H01L 29/7813* (2013.01); *H01L 2224/4813* (2013.01)

(58) Field of Classification Search
CPC ............. H01L 29/7813; H01L 29/7397; H01L 2224/4813; H01L 29/0696; H01L 29/41766; H01L 29/66727; H01L 22/34; H01L 29/402; H01L 29/404; H01L 21/768; H01L 21/823418; G01R 31/2644; G01R 31/025
See application file for complete search history.

(56) References Cited

U.S. PATENT DOCUMENTS

| | | |
|---|---|---|
| 2006/0273371 A1 | 12/2006 | Tohyama et al. |
| 2010/0123188 A1 | 5/2010 | Venkatraman |
| 2014/0097431 A1 | 4/2014 | Zundel et al. |
| 2015/0349113 A1* | 12/2015 | Katoh ................. H01L 29/7813 257/331 |
| 2015/0364588 A1* | 12/2015 | Laven ................. H01L 29/0615 257/139 |
| 2016/0126149 A1 | 5/2016 | Zelsacher et al. |

FOREIGN PATENT DOCUMENTS

| | | |
|---|---|---|
| DE | 102005041358 A1 | 3/2007 |
| DE | 102013111154 A1 | 2/2014 |

\* cited by examiner

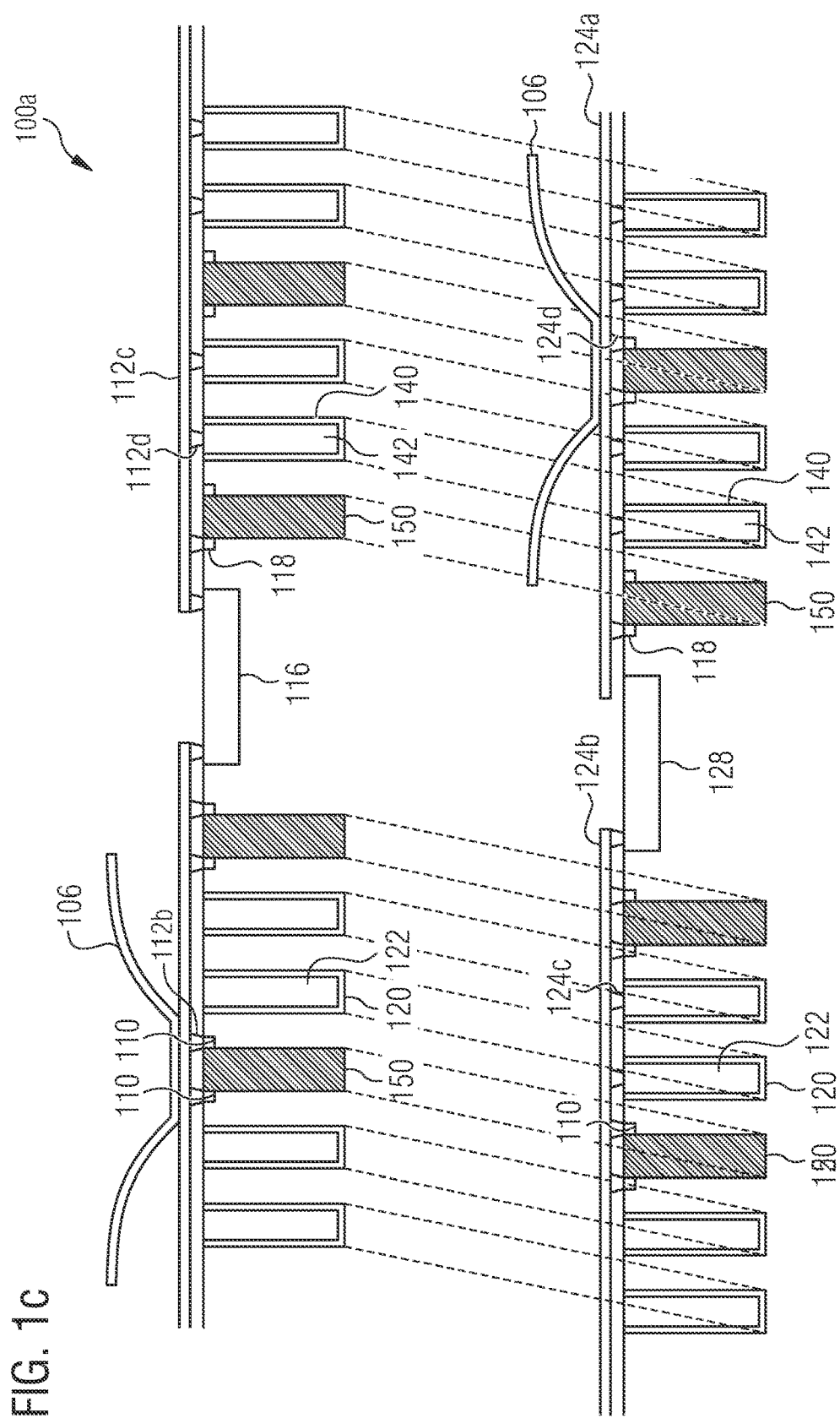

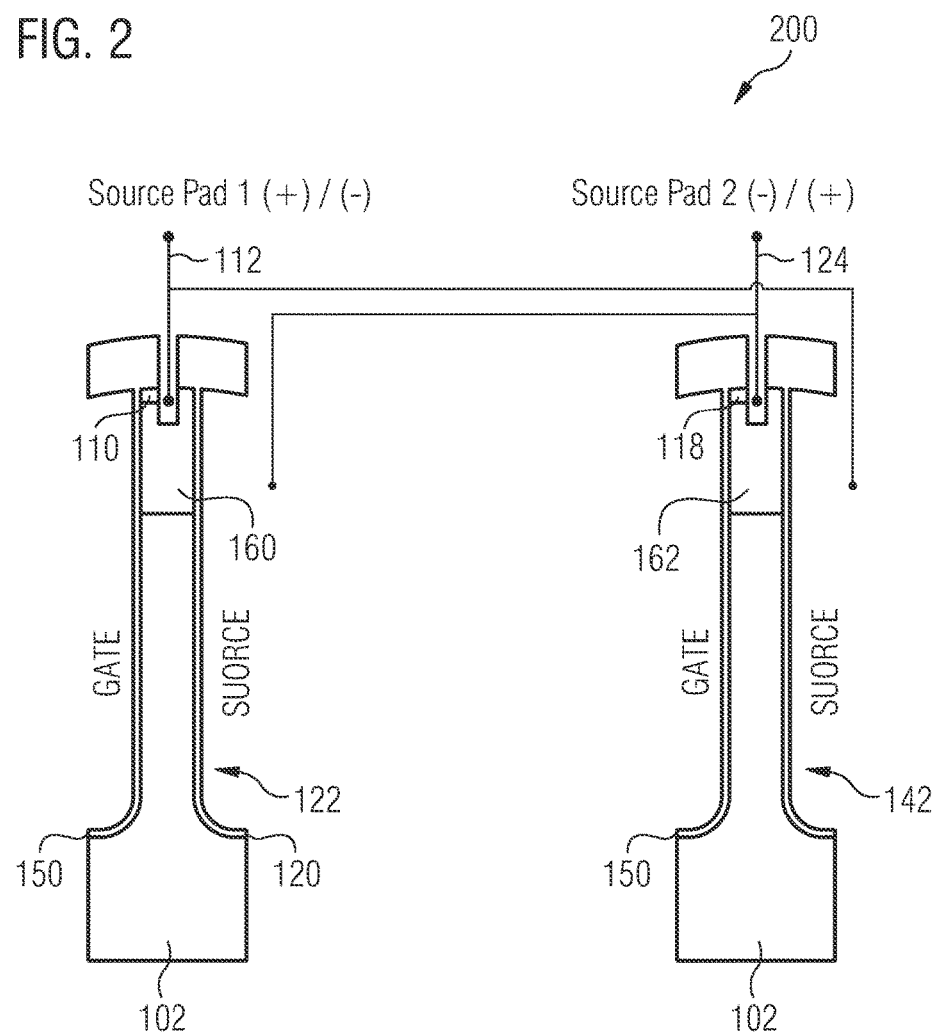

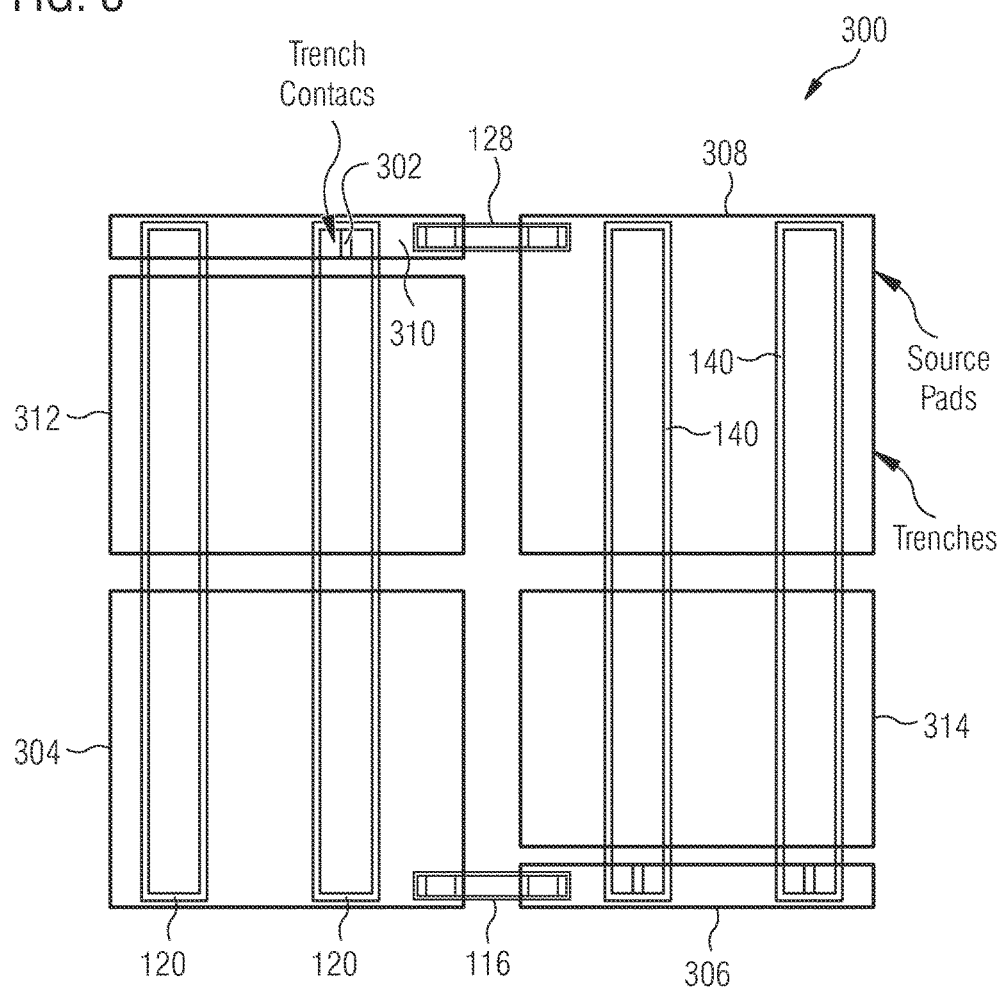

SEMICONDUCTOR DEVICE, METHOD FOR TESTING A SEMICONDUCTOR DEVICE AND METHOD FOR FORMING A SEMICONDUCTOR DEVICE

TECHNICAL FIELD

Embodiments relate to concepts for testing insulation layers within trenches, and in particular to semiconductor devices, methods for testing semiconductor devices and methods for forming semiconductor devices.

BACKGROUND

Testing semiconductor devices for manufacturing errors often is a necessary step in the production and quality control of semiconductor devices. For example, a testing of an insulation quality of various layers, e.g. oxide layers, may be performed to check for leaky insulations within the semiconductor device, which may lead to unwanted behavior or destruction of semiconductor devices.

SUMMARY

There may be a demand to provide an improved concept for semiconductor devices, which enables improving the testability of insulation layer quality and/or reducing the efforts and/or costs for detecting insulation layer defects.

Some embodiments relate to a semiconductor device comprising a first source wiring substructure connected to a plurality of source doping region portions of a transistor structure. The semiconductor device further comprises a second source wiring substructure connected to a plurality of source field electrodes located in a plurality of source field trenches extending into a semiconductor substrate of the semiconductor device. A contact wiring portion of the first source wiring substructure and a contact wiring portion of the second source wiring substructure are located at a wiring layer of a layer stack located on the semiconductor substrate. The contact wiring portion of the first source wiring substructure and the contact wiring portion of the second source wiring substructure comprise each a lateral size sufficient for a contact for at least a temporary test measurement. The wiring layer comprising the contact wiring portions is located closer to the semiconductor substrate than any ohmic electrical connection between the first source wiring substructure and the second source wiring substructure.

Some embodiments relate to a method for testing a semiconductor device. The method comprises applying a test voltage between a first source wiring substructure connected to a plurality of doping region portions of a transistor structure and a second source wiring substructure connected to a plurality of source field electrodes located in a plurality of source field trenches extending into a semiconductor substrate of the semiconductor device. The first source wiring substructure is electrically insulated from the second source wiring substructure in the wiring layer. The method further comprises measuring a leakage current between the first source wiring substructure and the second source wiring substructure caused by the applied test voltage.

Some embodiments relate to a method for forming a semiconductor device. The method comprises forming a plurality of source field trenches extending into a semiconductor substrate of the semiconductor device. The method further comprises forming a plurality of source field electrodes located in the plurality of source field trenches. The method further comprises forming a plurality of source doping region portions of a transistor structure. The method further comprises forming a first source wiring substructure connected to the plurality of source doping region portions and forming a second source wiring substructure connected to the plurality of source field electrodes. A contact wiring portion of the first source wiring substructure and a contact wiring portion of the second source wiring substructure are located in a wiring layer of a layer stack located on the semiconductor substrate. The contact wiring portion of the first source wiring substructure and the contact wiring portion of the second source wiring substructure comprise each a lateral size sufficient for a contact for a temporary test measurement. Further, the wiring layer comprising the contact wiring portions is located closer to the semiconductor substrate than any ohmic electrical connection between the first source wiring substructure and the second source wiring substructure.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which:

FIG. 2 shows a schematic cross section of a part of a semiconductor device, illustrating testing conditions in case of two isolated source pads;

FIG. 3-5 show schematic top views of semiconductor devices;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
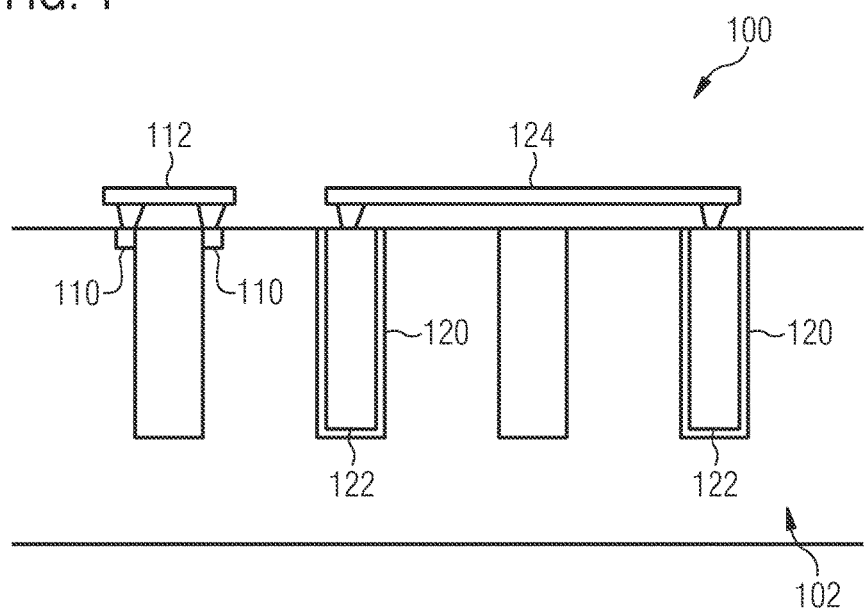
FIG. 1-1e shows schematic cross sections of parts of semiconductor devices.

FIG. 1 shows a schematic cross section of a semiconductor device 100 according to an embodiment. The semiconductor device comprises a first source wiring substructure 112 connected to a (first) plurality of source doping region portions 110 of a transistor structure. The semiconductor device 100 further comprises a second source wiring substructure 124 connected to a (first) plurality of source field electrodes 122 located in a (first) plurality of source field trenches 120 extending into a semiconductor substrate 102 of the semiconductor device 100. A contact wiring portion of the first source wiring substructure 112 and a contact wiring portion of the second source wiring substructure 124 are located at a wiring layer of a layer stack located on the semiconductor substrate 102. The contact wiring portion of the first source wiring substructure 112 and the contact wiring portion of the second source wiring substructure 124 comprise each a lateral size sufficient for a contact for at least a temporary test measurement. The wiring layer comprising the contact wiring portions is located closer to the semiconductor substrate 102 than any ohmic electrical connection between the first source wiring substructure 112 and the second source wiring substructure 124.

Using first and second source wiring substructures to electrically separate the plurality of source doping region portions and the plurality of source field trenches at the wiring layer may enable a testing of an insulation (e.g. an oxide) of the plurality of source field trenches against the plurality of source doping region portions in the backend. In this way, a costly front end test may be avoided. For example, the testability of insulation layer quality may be improved and/or the efforts and/or costs for detecting insulation layer defects may be reduced.

The contact wiring portion of the first source wiring substructure 112 may correspond to a lateral wiring portion (e.g. a portion of a metal layer) of sufficient lateral size for at least a temporary test measurement or to a vertical wiring portion (e.g. a via) of sufficient lateral size for at least a temporary test measurement, for example.

The contact wiring portion of the second source wiring substructure 124 may correspond to a lateral wiring portion (e.g. a portion of a metal layer) of sufficient lateral size for at least a temporary test measurement or to a vertical wiring portion (e.g. a via) of sufficient lateral size for at least a temporary test measurement, for example.

A lateral size of a contact wiring portion may be sufficient for at least a temporary test measurement, if a test needle (e.g. single needle or a needle of a needle card of a test system) or a probing tip of a test tool can be placed on the contact wiring portion for the test measurement. Additionally, the contact wiring portion may be used as a bond pad, which may be larger than a contact wiring portion used for a temporary contact for measurement only. A temporary test measurement may be a test measurement performed only once or serval times and afterwards not again. For example, the temporary test measurement may be a leakage current measurement through an insulation layer between the source field electrodes and the semiconductor substrate 102 (e.g. body doping portions adjacent to the source trenches).

The contact wiring portion of the first source wiring substructure 112 and the contact wiring portion of the second source wiring substructure 124 may comprise each a lateral size larger than 5 µm by 5 µm (or larger than 10 µm by 10 µm, larger than 20 µm by 20 µm. larger than 50 µm by 50 µm or larger than 100 µm by 100 µm), which may be sufficient for at least a contact for a temporary test measurement. For example, the contact wiring portions may correspond to individual source pads or to a test pad or intermediate contact pad located within the layer stack only accessible during manufacturing (e.g. before forming one or more source pads).

The contact wiring portion of the first source wiring substructure 112 or another lateral wiring portion of the first source wiring substructure 112 may laterally connect (e.g. form a lateral ohmic electrical connection) the plurality of source doping region portions 110 of the transistor structure. For example, vertical wiring portions of the first source wiring substructure 112 (e.g. vias) may extend from the plurality of source doping region portions to the contact wiring portion or the other lateral wiring portion of the first source wiring substructure 112.

The contact wiring portion of the second source wiring substructure 124 or another lateral wiring portion of the second source wiring substructure 124 may laterally connect (e.g. form a lateral ohmic electrical connection) the plurality of source field electrodes 122, for example. For example, vertical wiring portions of the second source wiring substructure 124 (e.g. vias) may extend from the plurality of source field electrodes to the contact wiring portion or the other lateral wiring portion of the second source wiring substructure 124.

For example, the second source wiring substructure 124 may comprise a lateral wiring portion between the plurality of source field electrodes 122 and the contact wiring portion of the second source wiring substructure 124. The lateral wiring portion may correspond to an additional conductive element (in comparison to the first source wiring substructure), for example. For example, the second source wiring substructure may comprise an additional lateral conductive element in comparison to the first wiring substructure, e.g. to form an ohmic electrical connection between the plurality of source field electrodes 122.

Figure 1A:
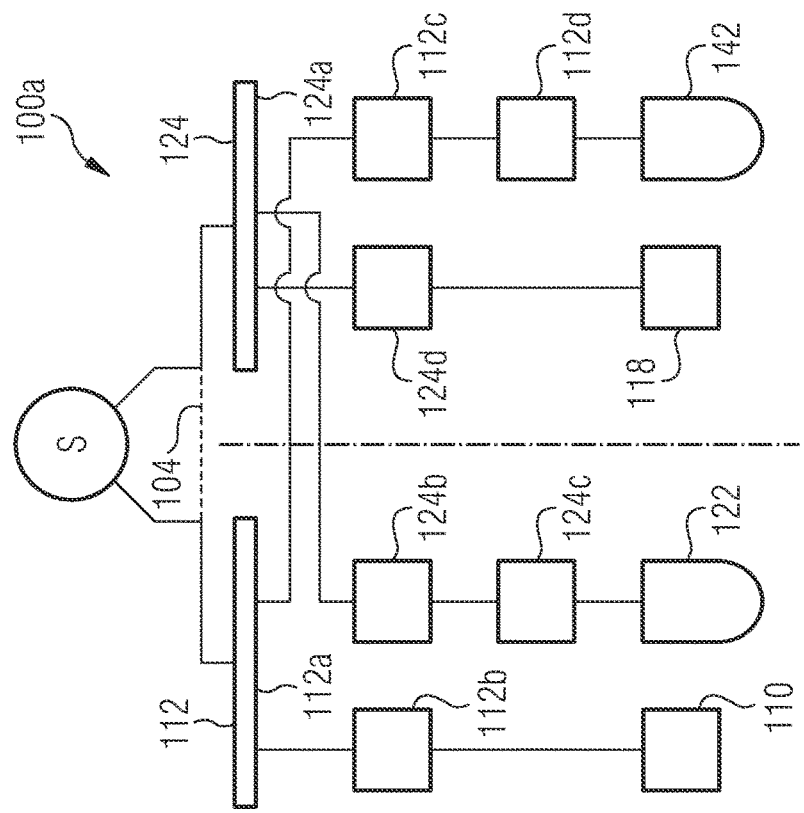

FIG. 1a shows a schematic cross section of a semiconductor device 100a. The semiconductor device 100a may be implemented similar to the semiconductor device described in connection with FIG. 1. The semiconductor device comprises a first source wiring substructure 112 connected to a (first) plurality of source doping region portions 110. The first source wiring substructure 112 comprises a contact wiring portion 112a and a (first) wiring portion 112b between the contact wiring portion 112a and the plurality of source doping region portions 110. The first wiring portion 112b of the first source wiring substructure 112 may correspond to a vertical wiring portion, for example. The semiconductor device further comprises a second source wiring substructure 124 connected to a (first) plurality of source field electrodes 122 located within a (first) plurality of source field trenches (120, as shown in FIG. 1c). The second wiring substructure 124 comprises a contact wiring portion 124a, a first wiring portion 124b and a second wiring portion 124c. One of the first wiring portion 124b or the second wiring portion 124c of the second source wiring substructure 124 may correspond to a lateral wiring portion, for example. The other one of the first wiring portion 124b or the second wiring portion 124c of the second source wiring substructure 124 may correspond to a vertical wiring portion, for example. One of the first wiring portion 124b or the second wiring portion 124c of the second source wiring substructure 124 may correspond to an additional conductive element (in comparison to the first source wiring substructure), for example. The first source wiring substructure 112 and the second source wiring substructure 124 may be connected by a bond wire 104 or a bond wire portion located between the contact wiring portions 112a and 124a, for example.

Figure 1B:
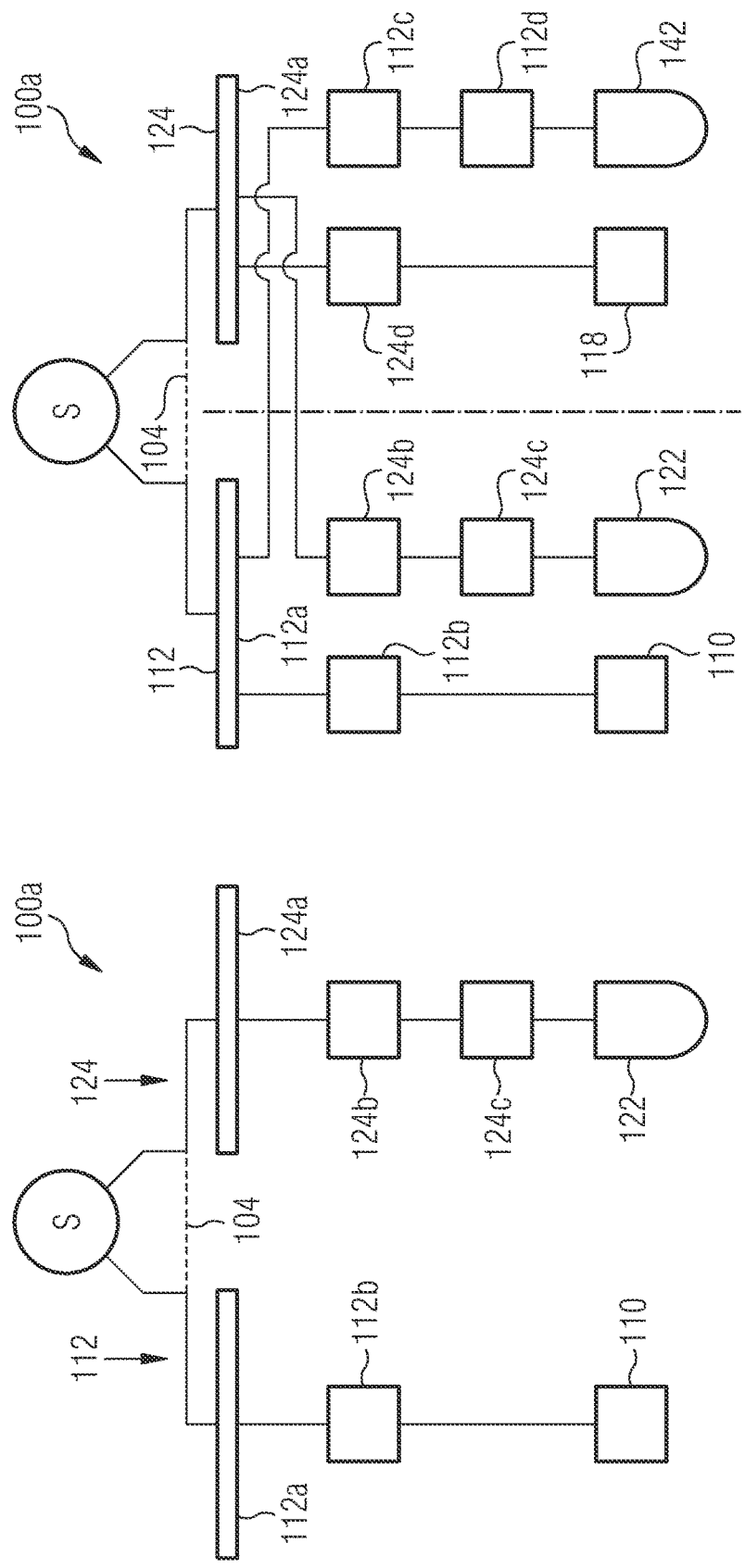

For example, the semiconductor device 100a may, as shown in FIG. 1b, further comprise a second plurality of source doping region portions 118 connected to the second source wiring substructure 124 via a third wiring portion 124d of the second source wiring substructure 124. The third wiring portion 124d of the second source wiring substructure 124 may correspond to a vertical wiring portion, for example. The semiconductor device 100a may further comprise a second plurality of source field electrodes 142 located within a second plurality of source field trenches (140, as shown in FIG. 1c). The second plurality of source field electrodes 142 may be connected to the first source wiring substructure 112 via a second wiring portion 112c and a third wiring portion 112d of the first source wiring substructure 112. One of the second wiring portion 112c or the third wiring portion 112d of the first source wiring substructure 112 may correspond to a lateral wiring portion, for example. The other one of the second wiring portion 112c or the third wiring portion 112d of the first source wiring substructure 112 may correspond to a vertical wiring portion, for example.

For example, the contact wiring portion 112a of the first source wiring substructure 112 may be connected to second wiring portion 112c of the first source wiring substructure 112 by a connecting structure 116 (e.g. a lateral connecting trench), as shown in FIG. 1c. In FIG. 1c, the second wiring portion 112c of the first source wiring substructure 112 corresponds to a lateral wiring portion between the contact wiring portion 112a of the first source wiring substructure 112 and the second plurality of source field electrodes 142. The lateral wiring portion 112c of the first source wiring substructure might not be bonded (connected to a bond wire), for example.

For example, the contact wiring portion 124a of the second source wiring substructure 124 may be connected to the first wiring portion 124b of the second source wiring substructure 124 by a connecting structure 128 (e.g. a lateral connecting trench), as further shown in FIG. 1c. In FIG. 1c, the first wiring portion 124b of the second source wiring substructure 124 corresponds to a lateral wiring portion between the contact wiring portion 124a of the second source wiring substructure 124 and the first plurality of source field electrodes 122. The lateral wiring portion 124b of the second source wiring substructure might not be bonded (connected to a bond wire), for example.

The contact wiring portions 112a; 124a of the first and second source wiring substructures may be connected to bond wires, e.g. bond wires mutually connecting the contact wiring portions or bond wires connecting the contact wiring portions to a package structure of the semiconductor device 100a. The semiconductor device 100a may further comprise a plurality of gate trenches 150, for example.

More details and aspects of the semiconductor device 100a are mentioned in connection with the proposed concept or one or more examples described above (e.g. FIG. 1, 1d to 7). The semiconductor device 100a may comprise one or more additional optional features corresponding to one or more aspects of the proposed concept or one or more examples described above or below.

For example, the wiring layer comprising the contact wiring portions may be a lateral wiring layer(e.g. metal layer) of the layer stack located on the semiconductor substrate 102 or a vertical wiring layer.

The lateral wiring layer may be located closer to the semiconductor substrate 102 than any ohmic electrical connection between the first source wiring substructure and the second source wiring substructure, for example. Alternatively, the wiring layer may correspond to a vertical wiring layer, e.g. a layer comprising via structures.

For example, a part of the second source wiring substructure 124 located between the plurality of source field electrodes 122 and the contact wiring portion of the second source wiring substructure 124 may be implemented by a connection trench electrode located in a connecting trench extending into the semiconductor substrate (and/or optionally the first source wiring substructure comprises a connection trench electrode for connecting a second plurality of source field electrodes), for example. For example, a direction of a largest lateral extension of the connecting trench and the connecting trench electrode may be orthogonal to a largest lateral extension of the plurality of source field trenches and the plurality of source field electrodes.

At least portions of the plurality of source field trenches 120 may be located vertically below the contact wiring portion of the first source wiring substructure 112. At least portions of the plurality of source field trenches 120 may be located vertically between a back-side surface of the semiconductor substrate 102 and the contact wiring portion of the first source wiring substructure, for example. For example, in a top view of the semiconductor device 100, at least portions of the plurality of source field trenches 120 may have a lateral overlap with the contact wiring portion of the first source wiring substructure.

For example, at least portions of the source doping region portions may be located vertically below the contact wiring portion of the first wiring substructure 112. For example, in a top view of the semiconductor device 100, at least portions of the plurality of source doping region portions 110 may have a lateral overlap with the contact wiring portion of the first source wiring substructure. The plurality of source field trenches 120 (and corresponding body regions) and the plurality of source doping region portions may be laterally arranged in a repetitive pattern below the contact wiring portion of the first wiring substructure 112, for example. The source regions may conduct large currents, while nearly no current may flow to the source trench electrodes so that a connection between the contact wiring portion of the first wiring substructure 112 and the source doping region portions can be kept short while the connection of the source field electrodes to the contact wiring portion of the second wiring substructure 124 can be longer, for example.

For example, the first source wiring substructure 112 and the second wiring substructure 124 may comprise metal portions (e.g. aluminum, copper and/or tungsten) and/or polysilicon portions (e.g. connecting trench electrode) implementing lines, layers, pads and/or vias.

The first source wiring substructure 112 may connect the plurality of source doping region portions of the transistor structure to a source contact interface of the first source wiring substructure 112 (e.g. first source pad) for connecting an external electrical device or an external source potential to the plurality of source doping region portions of the transistor structure, for example. The first source wiring substructure 112 may correspond to or comprise a source grid or one or more source metal layers. The contact wiring portion of the first source wiring substructure 112 may correspond to the (first) source pad of the first source wiring substructure 112 or an intermediate contact pad (e.g. implemented by a (large) via of the first source wiring substructure or a metal layer portion in a lateral wiring layer between the plurality of source doping region portions and the source pad of the first source wiring substructure) of the first source wiring substructure 112, for example.

A lateral ohmic electrical connection between the plurality of source doping region portions 110 may correspond to a portion of a metal layer (e.g. the contact wiring portion or another lateral wiring portion of the first source wiring substructure) connected to the plurality of source doping region portions 110 by vias, for example.

The second source wiring substructure 124 may connect the plurality of source field electrodes 122 of the transistor structure to a source contact interface (e.g. second source pad) for connecting an external electrical device or an external source potential to the plurality of source field electrodes 122 of the transistor structure, for example. The second source wiring substructure 124 may correspond to or comprise a source grid or one or more source metal layers.

The contact wiring portion of the second source wiring substructure 124 may correspond to the (second) source pad of the second source wiring substructure 124 or an intermediate contact pad (e.g. implemented by a (large) via of the second source wiring substructure or a metal layer portion in a lateral wiring layer between the plurality of source field electrodes and the source pad of the second source wiring substructure) of the second source wiring substructure, for example.

The lateral ohmic electrical connection between the plurality of source field electrodes 122 may correspond to a portion of a metal layer connected to the plurality of source field electrodes 122 (e.g. the contact wiring portion or another lateral wiring portion of the second source wiring substructure) by vias or to an electrode located within a trench connecting the plurality of source field electrodes, for example.

For example, the layer stack may comprise a (further) metal layer above (e.g. farther away from the semiconductor substrate than) the wiring layer comprising the contact wiring portions. An ohmic electrical connection between the first source wiring substructure and the second source wiring substructure may be at least partially provided through the (further) metal layer. For example, the further metal layer is located at a larger distance to the semiconductor substrate 102 than the wiring layer comprising the contact wiring portions. For example, the further metal layer may be formed after testing of leakage currents between the semiconductor substrate and the plurality of source field electrodes 122. For example, the first and second source wiring substructures may be connected to the metal layer using vias. For example, the further metal layer may be used to implement a common source pad connected to the first source wiring substructure (112) and the second source wiring substructure (124), if the contact wiring portions are implemented as intermediate test contact interfaces in a wiring layer below the common source pad.

The first source wiring substructure 112 may comprise a first source pad structure (e.g. comprising a pad metallization layer, for example copper or aluminum, or a barrier layer, for example titanium and/or titanium nitride, and a pad metallization layer) for bonding a wire or attaching a solder structure (e.g. a solder ball or solder pillar). The first source pad structure may be represented by the contact wiring structure of the first source wiring structure 112 or a pad structure located at a layer of the layer stack located at a larger distance to the semiconductor substrate than the wiring layer comprising the contact wiring portions. The second source wiring substructure 124 may further comprise a second source pad structure (e.g. comprising a pad metallization layer, for example copper or aluminum, or a barrier layer, for example titanium and/or titanium nitride, and a pad metallization layer) for bonding a wire or attaching a solder structure. The second source pad structure may be represented by the contact wiring structure of the second source wiring structure 124 or a pad structure located at a layer of the layer stack located at a larger distance to the semiconductor substrate than the wiring layer comprising the contact wiring portions. The first source pad structure and the second source pad structure may be located closer to the semiconductor substrate 102 than any ohmic electrical connection between the first source wiring substructure 112 and the second source wiring substructure 124, for example. The first source pad structure and the second source pad structure may comprise each a lateral size (e.g. laterally covered area) of more than 100 µm by 100 µm (or more than 200 µm by 200 µm, more than 500 µm by 500 µm, more than 500 µm by 1 mm, more than 1 mm by 1 mm, or more than 2 mm by 2 mm).

A first bond wire may be located between the first source pad structure and a package structure and a second bond wire may be located between the second source pad structure and the package structure. An ohmic electrical connection between the first source wiring substructure 112 and the second source wiring substructure 124 may be provided through the first bond wire, the second bond wire and the package structure, for example. Connecting the first and second source wiring substructures using wirebonds may enable testing of the source field trench oxide in the backend while the source wiring substructures are short circuited after bonding, for example. For example, the package structure may be a lead frame or package substrate of a package of the semiconductor device. Alternatively or additionally, a (first) bond wire may be located between the first source pad structure and the second source pad structure. The bond wire may ohmic electrically connect the first source wiring substructure 112 and the second source wiring substructure 124. A second bond wire may be located between the first or second source pad structure and the package structure, for example.

Figure 1D:
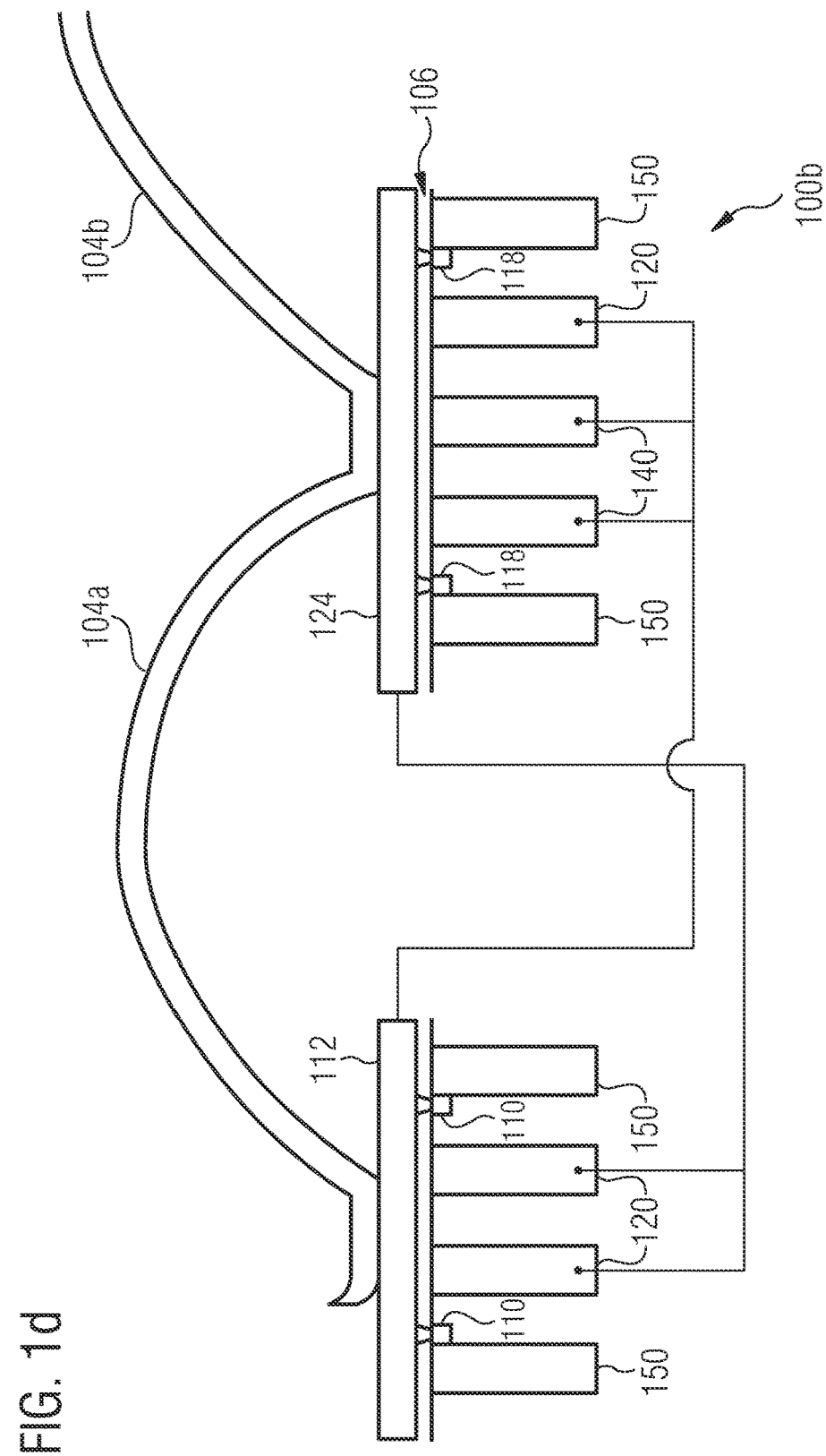

FIG. 1d shows a schematic cross section of a semiconductor device 100b. The semiconductor device 100b may be implemented similar to one of the semiconductor devices described in connection with FIGS. 1-1c. The semiconductor device 100b comprises a first source wiring substructure 112 connected to a first plurality of source doping region portions 110 and to a second plurality of source field electrodes located within a second plurality of source field trenches 140. The semiconductor device 100b further comprises a second source wiring substructure 124 connected to a first plurality of source field electrodes located within a first plurality of source field trenches 120 and to a second plurality of source doping region portions 118. The semiconductor device 100b further comprises a plurality of gate trenches 150. A contact wiring portion of the first source wiring substructure is connected to a contact wiring portion of the second source wiring substructure by a bond wire portion 104a located between the contact wiring portions. The second source wiring substructure may be further connected to a further contact wiring portion of a further source wiring substructure or to a package structure of the semiconductor device 100b by a further bond wire portion 104b. The contact wiring portions may be separated from the source doping region portions and from the source field electrodes by a dielectric 106, for example.

More details and aspects of the semiconductor device 100b are mentioned in connection with the proposed concept or one or more examples described above (e.g. FIG. 1-1c, 2 to 7). The semiconductor device 100b may comprise one or more additional optional features corresponding to one or more aspects of the proposed concept or one or more examples described above or below.

Alternatively, the first source wiring substructure 112 and the second source wiring substructure 124 may be ohmic electrically connected (e.g. short circuited) by a redistribution metal layer formed on the layer stack or a metal layer within the package (e.g. flip chip package) of the semiconductor device 100. For example, the package of the semiconductor device 100 may comprise a metal layer for a source potential, and the first source wiring substructure 112 and the second source wiring substructure may be electrically connected through the metal layer, for example.

For example, the first source wiring substructure 112 may be electrically insulated from the second source wiring substructure 124 at least within a lower most (lateral) wiring layer comprising the contact wiring portion of the first source wiring substructure implementing a lateral ohmic electrical connection between the plurality of source doping region portions of a transistor structure and the contact wiring portion of the second source wiring substructure 124 implementing a lateral ohmic electrical connection between the plurality of source field electrodes 122. Insulating the first and second source wiring substructures at least within the lower most (lateral) wiring layer may enable a testing of an insulation (e.g. an oxide) of the plurality of source field trenches against the plurality of source doping region portions in the backend. The lower-most (lateral) wiring layer may correspond to a metal layer of the layer stack located closer to the semiconductor substrate than other metal layers of the layer stack. The lower-most (lateral) wiring layer may correspond to a Metal 1 layer (M1) of the semiconductor device, for example.

The contact wiring portion of the first source wiring substructure 112 may be connected to the plurality of source doping region portions and to a source contact interface (source pad). The contact wiring portion of the second source wiring substructure 124 may be connected to the plurality of source field electrodes and to a source contact interface (source pad), for example. The contact wiring portion of the first source wiring substructure 112 may be connected to a different source contact interface than the contact wiring structure of the second source wiring substructure 124, for example. Alternatively, the contact wiring portion of the first source wiring substructure 112 may be connected to the same source contact interface as the contact wiring portion of the second source wiring substructure 124, e.g. if testing of leakage currents between the plurality of source doping region portions 110 and the plurality of source electrodes 122 is performed before forming the source contact interface.

For example, the first source wiring substructure 112 is electrically connected to the second source wiring substructure 124 outside a region located between a back-side surface of the semiconductor substrate and the wiring layer, for example. For example, the first source wiring substructure 112 may be electrically connected to the second source wiring substructure 124 at a package of the semiconductor device 100 or by a metal layer of the layer stack located further away from the semiconductor substrate 102 than the wiring layer. Electrically connecting the first and second source wiring substructures outside the region may enable a testing of an insulation (e.g. an oxide) of the plurality of source field electrodes against the semiconductor substrate in the backend.

For example, a depth of the plurality of source field trenches 120 may be larger than 5 times (or larger than 10 times) a depth of the source doping region portions. The plurality of source field trenches may be stripe-shaped (e.g. pillar-shaped or column-shaped in a cross section). A stripe-shape may be a geometry extending in a first lateral direction significantly farther than in an orthogonal second lateral direction. For example, the plurality of source field trenches 120 may comprise a lateral length of more than 10× (or more than 50× or more than 100×) a lateral width of source field trenches of the plurality of source field trenches 120. For example, the lateral length of a source field trench of the plurality of source field trenches 120 may be the largest lateral extension of the plurality of source field trenches 120. For example, the plurality of source field trenches 120 may comprise a vertical extension larger than the lateral width and shorter than the lateral length. For example, the plurality of source field trenches 120 may extend into a depth of more than 10 µm (or more than 30 µm or more than 50 µm). A source field electrode of the plurality of source field electrodes may be located in each source field trench 120 of the plurality of source field trenches 120. The source field electrodes are insulated from the semiconductor substrate by an insulation layer within the source field trenches 120.

The plurality of source doping region portions 110 may be located adjacent to gate trenches of the transistor structure, for example. The plurality of source doping region portions might not be located adjacent to any source field trench 120 of the plurality of source field trenches 120 of the transistor structure, for example.

For example, a number of source doping region portions and a number of source field trenches may be larger than 50 (or larger than 100 or larger than 500) within the semiconductor device 100. For example, the plurality of source field trenches 120 connected to the second source wiring substructure may comprise more than 10 (or more than 20 or more than 50) source field trenches. For example, the plurality of source doping region portions 110 connected to the first source wiring substructure may comprise more than 10 (or more than 20 or more than 50) source doping region portions.

For example, the transistor structure of the semiconductor device 100 comprises a plurality of body doping region portions located between the plurality of source doping region portions 110 and a drift region or drain region of the transistor structure. Each body doping region portion may be located between a gate trench and a source field trench (e.g. (directly) adjacent to a gate trench and (directly) adjacent to a source field trench 120 of the plurality of source field trenches 120) or between two neighboring gate trenches. The plurality of source doping region portions may comprise a first conductivity type, for example. Body regions of the transistor structure may comprise a second conductivity type, for example. A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, the second conductivity type indicates an opposite n-doped region or p-doped region. In other words, the first conductivity type may indicate a p-doping and the second conductivity type may indicate an n-doping or vice-versa.

The semiconductor substrate 102 of the semiconductor device 100 may be a silicon substrate. Alternatively, the semiconductor substrate 102 may be a wide band gap semiconductor substrate having a band gap larger than the band gap of silicon (1.1 eV). For example, the semiconductor substrate 102 may be a silicon carbide (SiC)-based semiconductor substrate, or gallium arsenide (GaAs)-based semiconductor substrate, or a gallium nitride (GaN)-based semiconductor substrate. The semiconductor substrate 102 may be a semiconductor wafer or a semiconductor die.

The transistor structure may be an Insulated-Gate Bipolar Transistor (IGBT) or a Field Effect Transistor (FET), for example. The transistor structure may be a vertical transistor arrangement, for example. For example, the vertical transistor arrangement may be an electrical structure enabling a vertical current flow For example, the transistor structure of the semiconductor device 100 may control and/or conduct and/or block a current flow between the front side of the semiconductor device and a backside of the semiconductor device. The transistor structure may comprise a breakdown voltage of more than 10V, e.g. more than 20V, more than 50V, more than 100V, for example. The semiconductor device 100 may be a power semiconductor device. A power semiconductor device and/or the transistor structure of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

Figure 1E:
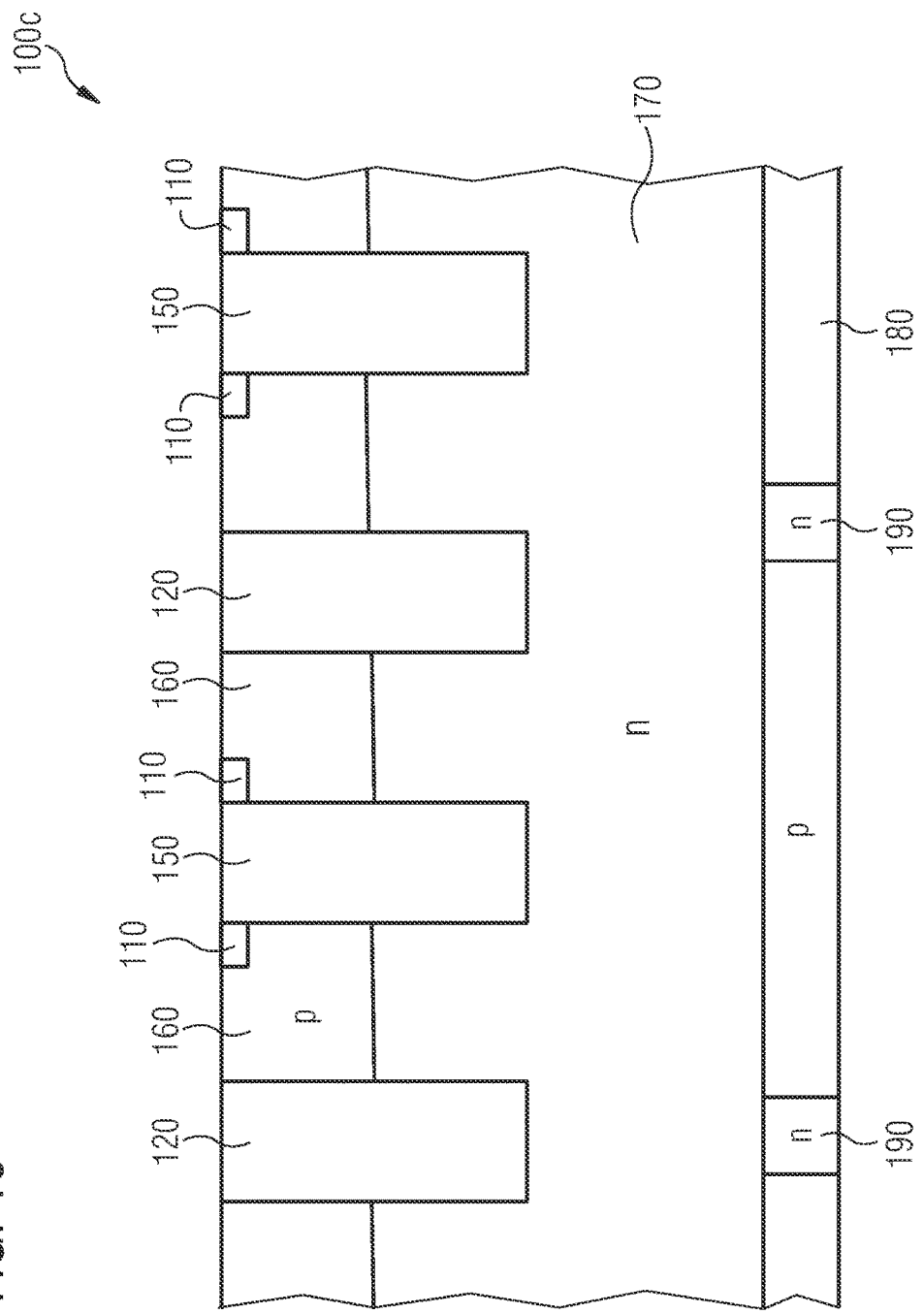

FIG. 1e shows a schematic cross section of a power semiconductor device 100c. The power semiconductor device 100c may be implemented similar to one of the semiconductor devices described in connection with FIGS. 1-1d. The power semiconductor device 100c comprises a plurality of source doping region portions 110, a plurality of source field trenches 120 comprising a plurality of source field electrodes, a plurality of gate trenches 150 comprising a plurality of gate electrodes, and a plurality of body doping region portions 160. The power semiconductor device 100c further comprises an n-drift region 170 and a p-drain region 180. Optionally, the semiconductor device 100c may further comprise at least one n-short 190 for a reverse conduction.

FIG. 1e shows an example of a reverse conducting RC insulated gate bipolar transistor IGBT. Similarly, normal IGBT may be implemented without the n-short portions 190. Further, similarly, a metal-oxide (MOX) semiconductor transistor may be implemented without p-doped regions at the backside. A metal-oxide (MOX) semiconductor transistor may comprise an n-doped region comprising the drift region and a highly doped backside drain doping region.

For example, the vertical direction and a vertical dimension or thicknesses of layers may be measured orthogonal to a front side surface of the semiconductor substrate 102 and a lateral direction and lateral dimensions may be measured in parallel to the front side surface of the semiconductor substrate 102.

The layer stack of the semiconductor device 100 may comprise one or more lateral wiring layers (e.g. metal layers) and one or more vertical wiring layers (e.g. via layers), for example.

A lateral wiring layer (e.g. metal layer of a layer stack of a semiconductor device) may be a layer for implementing lateral electrical connections between vertical electrical connections (vias) connecting lateral wiring layers. A vertical wiring layer (e.g. via layer of a layer stack of a semiconductor device) may be a layer for implementing vertical electrical connections (vias) between lateral wiring layers. For example, the portions of the first source wiring substructure 112 and portions of the second source wiring substructure 124 are located in one or more lateral wiring layers and one or more vertical wiring layers of the layer stack of the semiconductor device 100.

The front side of the semiconductor substrate may be the side used to implement more sophisticated and complex structures than at the back side of the semiconductor substrate, since the process parameters (e.g. temperature) and the handling may be limited for the back side, if structures are already formed at one side of the semiconductor substrate, for example. The layer stack of the semiconductor device 100 including the contact wiring portions (e.g. implementing source pads or including additionally source pads) is located at the front side of the semiconductor substrate 102.

FIG. 2 illustrates a schematic cross section of an embodiment of a semiconductor device 200, showing testing conditions in case of two isolated source pads. The semiconductor device 200 may be implemented similar to one of the semiconductor devices described in connection with FIGS. 1-1e.

In FIG. 2, the semiconductor device further comprises a plurality of gate trenches 150 extending into the semiconductor substrate 102. The first source wiring substructure 112 is connected to a first plurality of source doping region portions 110 and a first plurality of body doping region portions 160 located below a first source pad of the first source wiring substructure 112. The second source wiring substructure 124 is connected to a first plurality of source field electrodes 122 located in a first plurality of source field trenches 120 located below the first source pad of the first source wiring substructure 112. Further, the first source wiring substructure 112 is connected to a second plurality of source field electrodes 142 located in a second plurality of source field trenches 140 located below a second source pad of the second source wiring substructure 124. Additionally, the second source wiring substructure 124 is connected to a second plurality of source doping region portions 118 and a second plurality of body doping region portions 162 located below the second source pad of the second source wiring substructure 124.

Gate trenches of the plurality of gate trenches 150 may house a gate electrode and a transistor channel to be controlled by the gate electrode may be located adjacent to the gate trenches. A gate potential can be applied to the gate electrodes within the gate trenches through a gate wiring structure during operation of the semiconductor device 200.

A plurality of source doping region portions 110 is located laterally adjacent to the plurality of gate trenches, for example, e.g. directly laterally adjacent. No source doping region portions are located directly adjacent to the source field trenches. Locating the source doping region portions adjacent to the gate trenches only may reduce a risk of an electron channel being formed by a source field trench during testing. The semiconductor device 200 may further comprise a plurality of body doping region portions 160 of one or more body regions of the transistor structure. The plurality of body doping region portions 160 are connected to the first source wiring substructure 112. The plurality of body doping region portions 160 separate the plurality of source doping region portions from the plurality of source field trenches, which may avoid forming of an electron channel during testing, for example. For example, the first source wiring substructure 112 may comprise a plurality of common source-body contacts connected to the plurality of source doping region portions 110 and to the plurality of body doping region portions 160.

The plurality of body doping region portions 160 may be located laterally adjacent to the source field trenches of the plurality of source field trenches, for example. For example, the plurality of body doping region portions may be insulated from the source field electrodes 122 located within the plurality of source field trenches 120 by an oxide layer.

For example, n-doped source regions (e.g. of the plurality of source doping region portions) may be only adjacent to the gate trenches, (e.g. and not adjacent to source field trenches). This may block a possible electron channel, which may be formed by the source field trench at +50V if the n-source region would also be adjacent to the source field trench at test conditions. Furthermore, the drain potential of the device might also be at the potential of the source field trench during tests.

At test conditions, an electric field distribution and an electrostatic potential of an example were simulated, both in case of two isolated source pads (Gate=Source=0V, Source field trench=Drain=50V). The current flowing was in the range of several mA. The semiconductor device drew a current of 6 mA, while no electron channel was formed from the source contact to the source field trench. The highest electric field strength was between a body doping region portion of the plurality of body doping region portions and source field trench of the plurality of source field trenches, at approximately $3 \cdot 10^6$ Vcm$^{-1}$.

For example, the plurality of source doping region portions 110, the plurality of body doping region portions 160, the plurality of source field trenches 120 and/or the plurality of gate trenches may be laterally arranged in a repetitive pattern. Body doping region portions of the plurality of body doping region portions 160 may extend vertically further into the semiconductor substrate than source doping region portions of the plurality of source doping region portions 110, for example.

For example, a maximal depth of the plurality of gate trenches 150 may differ by less than 20% (or less than 10%, or less than 5%) from a maximal depth of the plurality of source field trenches 120. For example, a maximal depth of the plurality of gate trenches 150 may be larger than one times (or larger than 1.5 times or larger than 2 times) a maximal depth of the body doping region portions. The plurality of gate trenches may be stripe-shaped (e.g. pillar-shaped or column-shaped in a cross section). For example, the plurality of gate trenches 150 may comprise a lateral length of more than 10× (or more than 50× or more than 100×) a lateral width of gate trenches of the plurality of gate trenches 150. For example, the lateral length of a source field trench of the plurality of gate trenches 150 may be the largest lateral extension of the plurality of gate trenches 150. For example, the plurality of gate trenches 150 may comprise a vertical extension larger than the lateral width and shorter than the lateral length. For example, the plurality of gate trenches 150 may extend into a depth of more than 1 μm (or more than 2 μm or more than 3 μm).

More details and aspects of the semiconductor device 200 are mentioned in connection with the proposed concept or one or more examples described above or below (e.g. FIGS. 1 to 1e and 3 to 7). The semiconductor device 200 may comprise one or more additional optional features corresponding to one or more aspects of the proposed concept or one or more examples described above or below.

FIG. 3 illustrates a schematic top view of an embodiment of a semiconductor device 300, illustrating an example of proposed layout changes for implementing a SOX test in the backend. The semiconductor device 300 may be implemented similar to one of the semiconductor devices described in connection with FIG. 1 or 2. The semiconductor device 300 comprises a first source wiring substructure comprising a (first) source (sub) pad 304 (e.g. a contact wiring portion of the first source wiring substructure), a connecting trench electrode located in a connecting trench 116 and a lateral wiring portion 306. The first source sub pad is connected to a (first) plurality of source doping region portions located vertically below the first source sub pad 304. The lateral wiring portion 306 of the first source wiring substructure may be connected to a further (e.g. second) plurality of source field electrodes located in a further (e.g. second) plurality of source field trenches 140 extending into the semiconductor substrate of the semiconductor device 300.

For example, at least a part of an ohmic electrical connection between a source (sub) pad of the first source wiring substructure and the further plurality of source field trenches 140 may be provided by the trench electrode located within the connecting trench 116 of the first source wiring substructure. The connection trench electrode located within the connecting trench 116 of the first source wiring substructure may enable the ohmic electrical connection of the first source (sub) pad 304 of the first source wiring substructure and the further plurality of source field trenches 140 without requiring additional wiring within the layer stack, for example.

The semiconductor device 300 comprises a second source wiring substructure comprising a (second) source (sub) pad 308 (e.g. a contact wiring portion of the second source wiring substructure), a connecting trench electrode located in a connecting trench 128 and a lateral wiring portion 310. The lateral wiring portion 310 of the second source wiring substructure is connected to a (first) plurality of source field electrodes located in a (first) plurality of source field trenches 120, e.g. via contacts (e.g. a contact 302 connecting the lateral wiring portion 310 and the source field electrode of a source field trench 120).

The first and second source wiring substructures being connected to both source doping region portions and source field electrodes may reduce a number of at least partly separated wiring structures and may enable mutual testing.

For example, the second source sub pad 308 may be further connected to a further (second) plurality of source doping region portions of the transistor structure. At least portions of the second plurality of source doping region portions may be located vertically below the second source sub pad 308 of the second source wiring substructure, for example.

The second plurality of source field trenches 140 and the second plurality of source doping region portions may be laterally arranged in a repetitive pattern, for example.

For example, at least a part of an ohmic electrical connection between the plurality of source field electrodes located within the first plurality of source field trenches 120 and the second source sub pad 308 of the second source wiring substructure may be implemented by the connection trench electrode located in the connecting trench 128 of the second source wiring substructure.

For example, at least portions of the second plurality of source field trenches 140 may be located vertically between a back-side surface of the semiconductor substrate and the second source sub pad 308 of the second source wiring substructure (e.g. vertically below the second source sub pad 308 of the second source wiring substructure in a top view of the semiconductor device 300). At least portions of the first plurality of source field trenches 120 may be located vertically between a back-side surface of the semiconductor substrate and the first source sub pad 304 of the first source wiring substructure (e.g. vertically below the first source sub pad 304 of the first source wiring substructure in a top view of the semiconductor device 300). The semiconductor device 300 may comprise a third source sub pad 312 and a fourth source sub pad 314. At least portions of the first plurality of source field trenches 120 may be located vertically below the third source sub pad 312 and at least portions of the second plurality of source field trenches 140 may be located vertically below the fourth source sub pad 314 (in a top view of the semiconductor device).

For example, the third source sub pad 312 may be connected to a third plurality of source doping region portions of a transistor structure of the semiconductor device. The fourth source sub pad 314 may be connected to a fourth plurality of source doping region portions of the transistor structure.

For example, the first source sub pad may be connected to a first body region portion of a body region of the transistor structure. The second source sub pad may be connected to a second body region portion of the body region. The third source sub pad may be connected to a third body region portion of the body region. The fourth source sub pad may be connected to a fourth body region portion of the body region. The first body region portion may be laterally separated from the second body region portion (and/or the third body region portion, and/or the fourth body region portion) by an isolation trench or by a doping region having a conductivity type being different from a conductivity type of the body region. The second body region portion may be laterally separated from the first body region portion (and/or the third body region portion, and/or the fourth body region portion) by an isolation trench or by a doping region having a conductivity type being different from a conductivity type of the body region.

This may enable the testing of the portions of the source field trenches located between the back-side surface of the semiconductor substrate and the contact wiring portion of the second source wiring substructure.

The connecting trenches 116, 128 may be implemented similar to the plurality of source field trenches, for example. The connecting trenches may be arranged orthogonally to the plurality of source field trenches (e.g. formed by the same trench etching process and comprising a substantially equal depth), for example. The connection electrodes located within the connecting trenches 116, 128 may comprise highly doped polysilicon, for example.

The further plurality of source field trenches 140 may be implemented similar to the plurality of source field trenches 120, and/or the further plurality of source doping region portions may be implemented similar to the plurality of source doping region portions 110 described in connection with FIG. 1.

More details and aspects of the semiconductor device 300 are mentioned in connection with the proposed concept or one or more examples described above or below (e.g. FIGS. 1 to 2, 4 to 7). The semiconductor device 300 may comprise one or more additional optional features corresponding to one or more aspects of the proposed concept or one or more examples described above or below.

Figure 4:
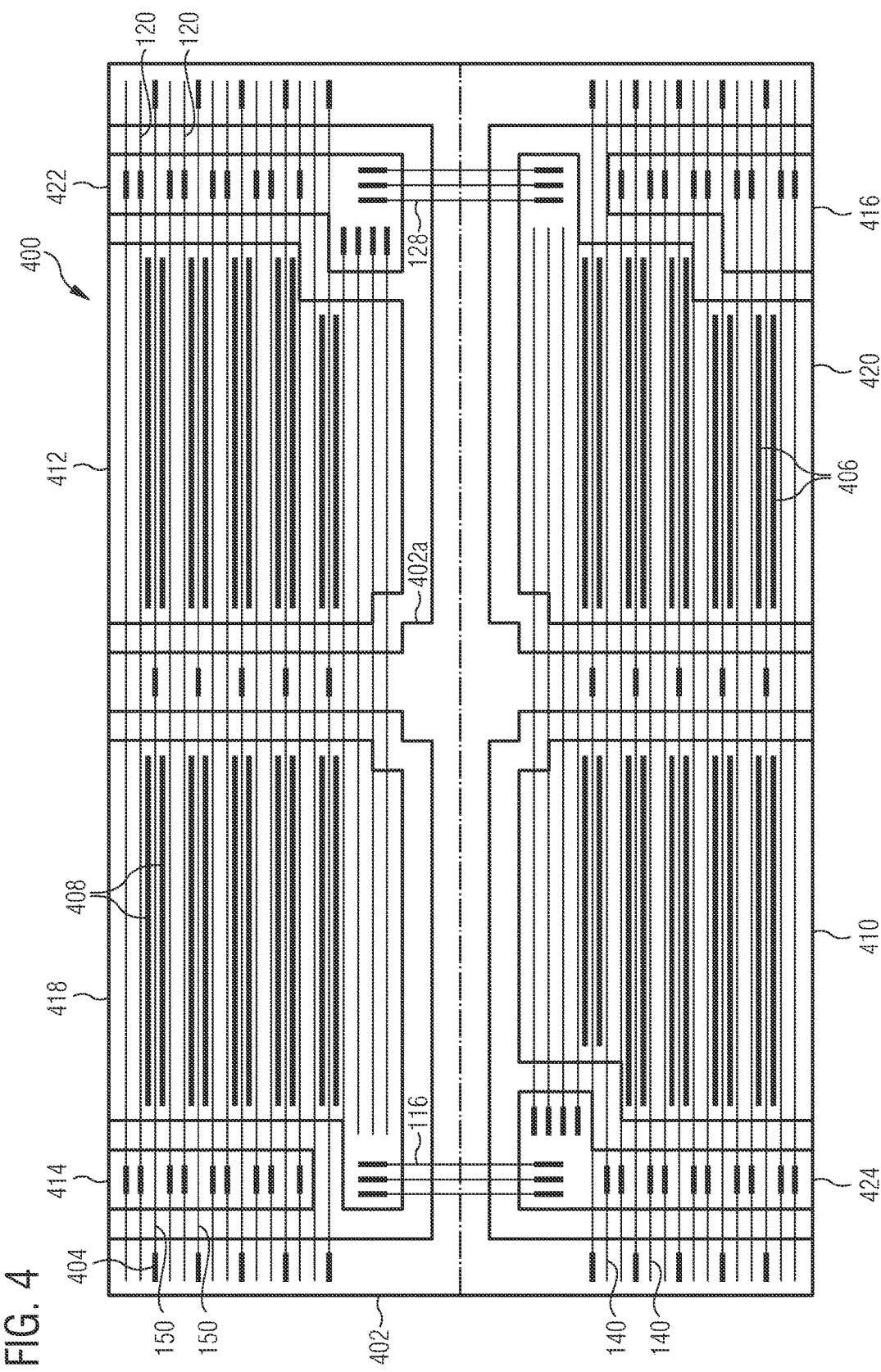

FIG. 4 shows a schematic top view of an embodiment of a semiconductor device 400. The semiconductor device 400 may be implemented similar to one of the semiconductor devices described in connection with FIGS. 1 to 3. The semiconductor device 400 comprises a first source wiring substructure comprising a (first) source (sub) pad 418 (e.g. a contact wiring portion of the first source wiring substructure), a connecting trench electrode located in a connecting trench 116 and a lateral wiring portion 424. The first source sub pad 418 is connected to a (first) plurality of source doping region portions located vertically below the first source sub pad 418. The lateral wiring portion 424 of the first source wiring substructure may be connected to a further (e.g. second) plurality of source field electrodes located in a further (e.g. second) plurality of source field trenches 140 extending into the semiconductor substrate of the semiconductor device 400.

The semiconductor device 400 comprises a second source wiring substructure comprising a (second) source (sub) pad 420 (e.g. a contact wiring portion of the second source wiring substructure), a connecting trench electrode located in a connecting trench 128 and a lateral wiring portion 422. The lateral wiring portion 422 of the second source wiring substructure is connected to a (first) plurality of source field electrodes located in a (first) plurality of source field trenches 120. For example, the second source sub pad 420 may be further connected to a further (second) plurality of source doping region portions of a transistor structure of the semiconductor device. At least portions of the second plurality of source doping region portions may be located vertically below the second source sub pad 420 of the second source wiring substructure, for example.

The semiconductor device 400 may further comprise contacts 406 for connecting the second plurality of source doping region portions to the second source wiring substructure, e.g. via the second source sub pad 420. The semiconductor device 400 further comprises contacts 408 for connecting the first plurality of source doping region portions to the first source sub pad 418.

The semiconductor device 400 may further comprise a gate runner 402 (a gate metal) of a gate wiring structure connecting gate electrodes located in gate trenches 150 to a gate pad 402a, e.g. a center gate pad. The gate runner may be connected to the gate electrodes located in the gate trenches 150 using contacts, e.g. contact 404. Contacts may be shown as solid rectangles in FIG. 4. The gate runner 402 may be tunneled under by the connecting trench electrodes located in the connecting trenches 116; 128 when connecting different portions of the first source wiring substructure or different portions of the second source wiring substructure, respectively, for example.

The semiconductor device 400 may comprise additional source sub pads 410, 412, which may be used for connecting additional source doping region portions. The first source wiring substructure may further comprise additional metal portions 414, 416, e.g. for a redundant ohmic electrical connection of the plurality of source field electrodes or for probing. The metal trace 416 and/or the lateral wiring portion 424 may comprise a sense pad or have at least the size of a sense pad (e.g. 275 µm×275 µm), for example. A distance between trenches being arranged orthogonally (e.g. between source field trenches and connecting trenches) may be at least 500 nm (or at least 1 µm, at least 2 µm, at least 5 µm or at least 10 µm), for example. P-bodies (body doping region portions having a p-doping) and dwell may be separated, e.g. using a LOCal Oxidation of Silicon (LO-COS) region. Contact holes of the connection electrodes located within the connecting trenches 116; 128 may be implemented similar to contact holes of gate electrodes, for example.

More details and aspects of the semiconductor device 400 are mentioned in connection with the proposed concept or one or more examples described above or below (e.g. FIGS. 1 to 3, 5 to 7). The semiconductor device 400 may comprise one or more additional optional features corresponding to one or more aspects of the proposed concept or one or more examples described above or below.

Figure 5:
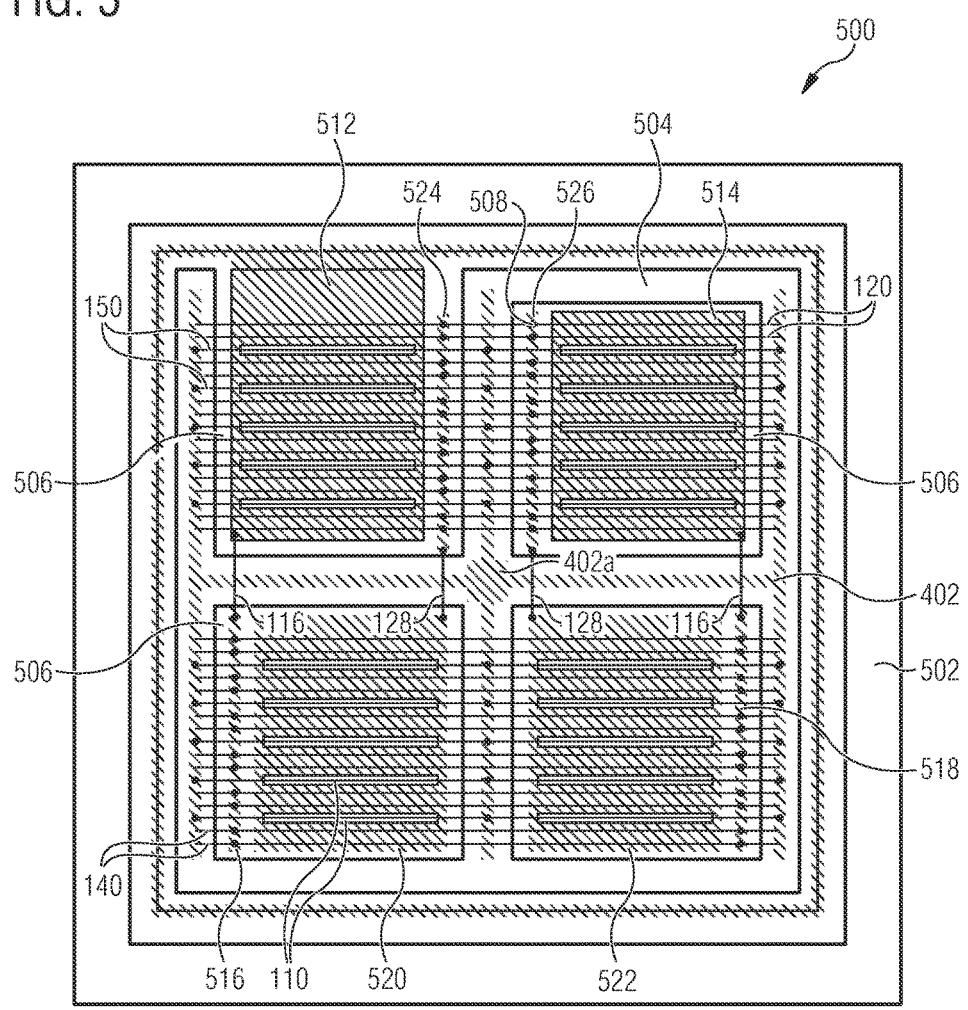

FIG. 5 shows a schematic top view of an embodiment of a semiconductor device 500. The semiconductor device 500 may be implemented similar to one of the semiconductor devices described in connection with FIGS. 1 to 4.

The semiconductor device 500 comprises a first source wiring substructure comprising a first source sub pad 512 (e.g. a contact wiring portion of the first source wiring substructure), a second source sub pad 514 (e.g. a contact wiring portion of the first source wiring substructure), connecting trench electrodes located in a connecting trenches 116 and lateral wiring portions 516; 518. The first source sub pad 512 is connected to a first plurality of source doping region portions located vertically below the first source sub pad 512. The second source sub pad 514 is connected to a second plurality of source doping region portions located vertically below the second source sub pad 514. The lateral wiring portions 516; 518 of the first source wiring substructure are connected to a further (e.g. second) plurality of source field electrodes located in a further (e.g. second) plurality of source field trenches 140 extending into the semiconductor substrate of the semiconductor device 500. An ohmic electrical connection between the lateral wiring portions may be provided by the second plurality of source field electrodes 140, for example. For example, at least parts of an ohmic electrical connection between the first source sub pad and the second source sub pad (and of the first plurality of source doping region portions and the second plurality of source doping region portions) may be provided by the second plurality of source field electrodes 140, for example.

The semiconductor device 500 comprises a second source wiring substructure comprising a third source sub pad 520 (e.g. a contact wiring portion of the second source wiring substructure), a fourth source sub pad 522 (e.g. a contact wiring portion of the second source wiring substructure), connecting trench electrodes located in connecting trenches 128 and lateral wiring portion 524, 526. The lateral wiring portions 524; 526 of the second source wiring substructure are connected to a (first) plurality of source field electrodes located in a (first) plurality of source field trenches 120, e.g. via contacts, e.g. via contact 508. For example, the third source sub pad 520 may be further connected to a third plurality of source doping region portions of the transistor structure of the semiconductor device and the fourth source sub pad 522 may be further connected to a fourth plurality of source doping region portions of the transistor structure. At least portions of the third plurality of source doping region portions may be located vertically below the third source sub pad 520 of the second source wiring substructure and at least portions of the fourth plurality of source doping region portions may be located vertically below the fourth source sub pad 524 of the second source wiring substructure, for example.

The semiconductor substrate may comprise a cell region (or active region) laterally surrounded by an edge termination region. The cell region may be a region of the semiconductor substrate used to conduct more than 90% of a current through the semiconductor substrate in an on-state or conducting state of the transistor arrangement (or the whole semiconductor device). For example, the cell region may be an area containing all source regions of the transistor arrangement or of all transistor structures of the semiconductor device. The edge termination region may be located between an edge of the semiconductor substrate and the cell region in order to support or block or reduce or dissipate a maximal voltage applied between the front side surface of the semiconductor substrate and a back side surface of the semiconductor substrate within the cell region laterally towards the edge of the semiconductor substrate.

For example, the semiconductor device may comprise an edge termination structure. The edge termination structure may be connected to one of the first source wiring substructure and the second source wiring substructure, for example. The edge termination structure may be connected to the plurality of source doping region portions, for example. For example, a portion of a lateral wiring layer may implement the connection between the edge termination structure and one of the first source wiring substructure, the second source wiring substructure or the plurality of source doping region portions. The edge termination structure may be laterally located between an edge of the semiconductor device and the active region/cell region of the semiconductor device. The edge termination structure may laterally encompass the active region/cell region of the semiconductor device. The edge termination structure may be one of a plurality of edge termination structures of an edge termination region of the semiconductor device, for example. The edge termination structure may be configured to laterally decrease a voltage applied between the front side surface of the semiconductor substrate and the back side surface of the semiconductor substrate within the cell region laterally towards the edge of the semiconductor substrate.

The semiconductor device 500 comprises a HV (High Voltage) termination edge 502, which may comprise a deep p+-doping region, for example. The HV termination edge 502 may correspond to the edge termination structure, for example. The semiconductor device 500 further comprises a blocking area 504, which may be used to enable a >60V blocking area between separated transistor areas. For example, the blocking area 504 may be at least 10 µm (or at least 20 µm, at least 40 µm, at least 50 µm, at least 60 µm) wide. The blocking area 504 may be at least at least ~60 µm wide, for example. The width of the blocking area 504 may depend on a doping concentration of the blocking area 504, for example. The blocking area 504 may comprise an n-doping region, for example. The semiconductor device 500 may further comprise body regions 506, which may correspond to p doping regions, for example. Contacts are shown as black square shapes in FIG. 5. The semiconductor device 500 may further comprise a gate runner 402 (a gate metal) of a gate wiring structure connecting gate electrodes located in gate trenches 150 to a gate pad 402*a*, e.g. a center gate pad. The semiconductor device 500 may further comprise a metal runner to contact source field electrodes, e.g. source field electrodes located inside the further plurality of source field trenches. The first source sub pad 512 may be connected to the HV termination edge 502. For example, a contact wiring portion of the first source wiring substructure or a contact wiring portion of the second source wiring substructure may be connected to an edge of the semiconductor device.

More details and aspects of the semiconductor device 500 are mentioned in connection with the proposed concept or one or more examples described above or below (e.g. FIGS. 1 to 4, 6 to 7). The semiconductor device 500 may comprise one or more additional optional features corresponding to one or more aspects of the proposed concept or one or more examples described above or below.

For example, a proposed semiconductor device may comprise a trench filled with a field electrode in a vertical projection of a load electrode (a first source pad) but not in electrical contact with said load electrode (the first source pad) except via an (ohmic) electrical connection using a bond wire or similar "post-wafer-fab-technology", for example.

Embodiments may further provide a wafer-level testing scheme (e.g. a method 600 of FIG. 6) applying a testing voltage of e.g. 50V between different source pads on a chip and detecting a leakage current.

In various embodiments, body regions (e.g. body doping region portions) in vertical projection of the separate load electrodes may be separated by oxide regions and/or n-doped regions (i.e. the body-regions of the separate IGBT-load areas may be electrically isolated within the chip).

In at least some embodiments, field electrodes contacted to the load electrodes of the chip might be connected (e.g. exclusively connected) via submerged bus lines (cross-connecting trenches or meander trenches), for example.

In the case of only two source sub-pads, during tests, oxide in the source field trenches below pad 1 (e.g. of the first source wiring substructure) and oxide in the source field trenches below pad 2 (e.g. of the second source wiring substructure) may be tested simultaneously, e.g. with the difference that they may be subjected to the opposite voltage polarity. For example, one part of the SOX may see an IGES (Current Gate-Emitter Short) test; the other part may see an IEGS (Current Emitter-Gate Short) test. In order to avoid to high charge currents, tests may be conducted at reduced potential difference, for example, i.e. 40V instead of 55V.

Embodiments may provide semiconductor devices, which may allow for an explicit test of conductivity of the cross-connecting trenches, for example.

In various embodiments, the silicon mesa (e.g. a source doping region portion of the plurality of source doping region portions) and the neighboring trench (e.g. a source field electrode of the plurality of source field electrodes) can be brought on a different potential to detect oxide defects (e.g. by using buried trenches filled with polysilicon running below the gate runner). Later, during bonding, this potential difference may be eliminated. This may enable checking source field trench oxides for defects.

Figure 6:
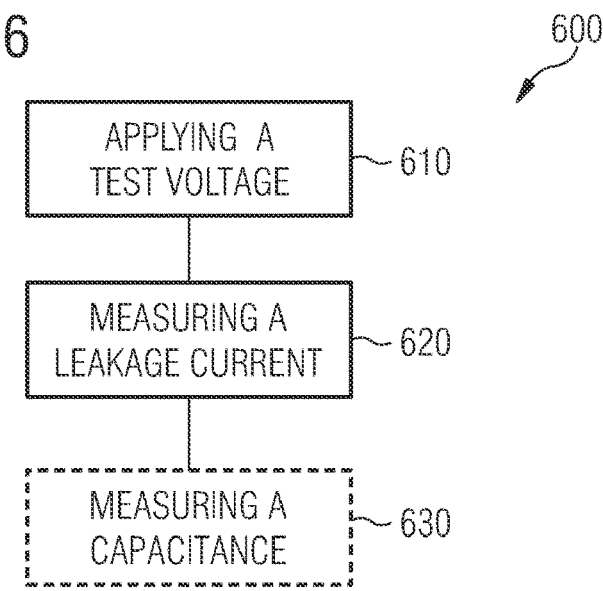
FIG. 6 illustrates a flow chart of an embodiment of a method for testing a semiconductor device.

FIG. 6 illustrates a flow chart of an embodiment of a method 600 for testing a semiconductor device. The method 600 comprises applying 610 a test voltage between a first source wiring substructure connected to a plurality of doping region portions of a transistor structure and a second source wiring substructure connected to a plurality of source field electrodes located in a plurality of source field trenches extending into a semiconductor substrate of the semiconductor device. The first source wiring substructure is electrically insulated from the second source wiring substructure within the wiring layer. The method further comprises measuring 620 a leakage current between the first source wiring substructure and the second source wiring substructure caused by the applied test voltage.

Testing the semiconductor device before an ohmic electrical connection between the first and second source wiring substructures is added may enable a testing of an insulation (e.g. an oxide) of the plurality of source field electrodes against the semiconductor substrate in the backend.

For example, a contact wiring portion of the first source wiring substructure and a contact wiring portion of the second source wiring substructure may be located in a wiring layer of a layer stack located on the semiconductor substrate. The contact wiring portion of the first source wiring substructure and the contact wiring portion of the second source wiring substructure may comprise each a lateral size sufficient for a contact for a temporary test measurement.

The semiconductor device may be implemented similar to one of the semiconductor devices described in connection with FIGS. 1 to 5. The test voltage may be larger than 5V (larger than 10V, larger than 20V, larger than 30V, larger than 50V or larger than 60V, for example). A potential applied to a wiring structure connected to a drain region of the transistor structure may be at the potential of the plurality of source field electrodes, for example. For example, the test voltage may comprise two opposing potentials. For example, a first potential may be applied to the first source wiring substructure, and a second potential, which may correspond to a negative first potential, may be applied to the second source wiring substructure. For example, the first and second potential may be lower than a potential applied when no negative counter-potential is applied. For example, the semiconductor device may be fully functional during testing.

Further, a simple test may be implemented to check whether the cross-connecting trenches are conducting. This may be done e.g. by a simple capacitive measurement measuring the capacitance between the first pad and the second pad In case of a failure of the cross-connecting trenches, the capacitance may be reduced as no buried trenches might be connected to the second pad For example, the method 600 may further comprise measuring 630 a capacitance between the first source wiring substructure (e.g. the contact wiring portion of the first source wiring substructure or a pad structure of the first source wiring substructure) and the second source wiring substructure (e.g. the contact wiring portion of the second source wiring substructure or a pad structure of the second source wiring substructure). Measuring the capacitance may enable detecting failures in the connection (e.g. cross-connecting trenches) between the contact wiring portion of the second source wiring substructure and the plurality of source field electrodes, for example.

More details and aspects of the method 600 are mentioned in connection with the proposed concept or one or more examples described above or below (e.g. FIGS. 1 to 5, 7). The method 600 may comprise one or more additional optional features corresponding to one or more aspects of the proposed concept or one or more examples described above or below.

Figure 7:
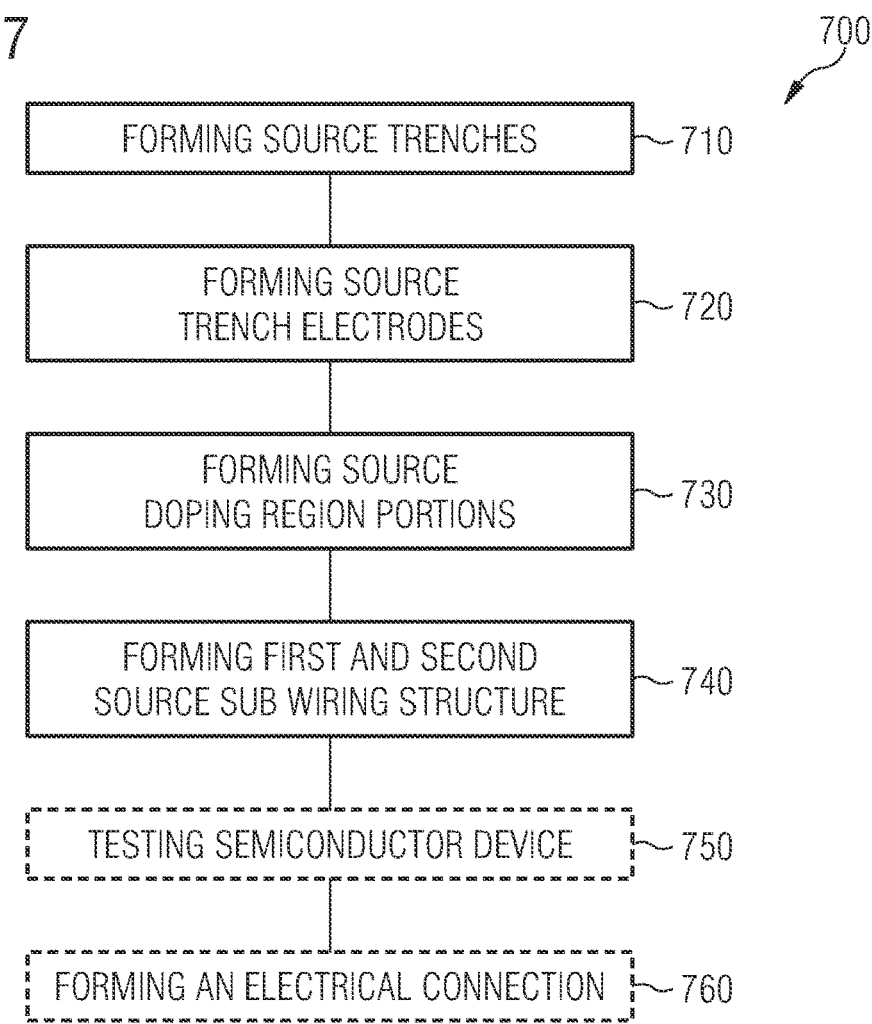
FIG. 7 illustrates a flow chart of an embodiment of a method 700 for forming a semiconductor device.

FIG. 7 illustrates a flow chart of a method 700 for forming a semiconductor device according to an embodiment. The semiconductor device may be implemented similar to one of the semiconductor devices described in connection with FIGS. 1 to 6. The method comprises forming 710 a plurality of source field trenches extending into a semiconductor substrate of the semiconductor device. The method 700 further comprises forming 720 a plurality of source field electrodes located in the plurality of source field trenches. The method further comprises forming 730 a plurality of source doping region portions of a transistor structure. The method further comprises forming 740 a first source wiring substructure connected to the plurality of source doping region portions and a second source wiring substructure connected to the plurality of source field electrodes. A contact wiring portion of the first source wiring substructure and a contact wiring portion of the second source wiring substructure are located in a wiring layer of a layer stack located on the semiconductor substrate. The contact wiring portion of the first source wiring substructure and the contact wiring portion of the second source wiring substructure comprise each a lateral size sufficient for a contact for a temporary test measurement. The wiring layer comprising the contact wiring portions is located closer to the semiconductor substrate than any ohmic electrical connection between the first source wiring substructure and the second source wiring substructure. For example, the first source wiring substructure is insulated from the second source wiring substructure within the wiring layer.

The forming 730 of the plurality of source doping region portions may be executed before or after the forming 710 of the plurality of source field trenches and the forming 720 of the plurality of source field electrodes, for example.

Forming first and second source wiring substructures may enable a testing of an insulation (e.g. an oxide) of the plurality of source field trenches against the plurality of source doping region portions in the backend, which may reduce a time required for manufacturing in the front-end.

For example, the method 700 may further comprise testing 750 the semiconductor device by applying a test voltage between the first source wiring substructure and the second source wiring substructure and measuring a leakage current between the first source wiring substructure and the second source wiring substructure caused by the test voltage. The testing 750 may comprise elements of the method described in connection with FIG. 6, for example. Testing the source field trench oxide before the forming of the ohmic electrical connection between the first and second source wiring substructures is formed enables a usage of common body-source contacts while maintaining testability of the device in the backend.

For example, the method 700 may further comprise forming 760 an ohmic electrical connection between the first source wiring substructure and the second source wiring substructure after measuring the leakage current.

More details and aspects of the method 700 are mentioned in connection with the proposed concept or one or more examples described above or below (e.g. FIGS. 1 to 6). The method 700 may comprise one or more additional optional features corresponding to one or more aspects of the proposed concept or one or more examples described above or below.

For current stripe cell IGBT designs (e.g. Micro Pattern Trench (MPT)), many variants may comprise alternating numbers of trenches on gate and source potential. In this context, it may be necessary for controlling for defect density to test the gate oxide for defects by applying a potential between the gate trench and the silicon mesa. This may e.g. be done cost-efficiently in the backend. For the same reasons, also the source field trench oxides may be tested. However, a test in the backend might not be feasible for other chip technologies, as the mesa potential and the trench potential may both be on source potential, for example.

In other designs, this may be addressed by introducing a special source oxide (SOX) test inline where a potential between the etched trenches—after oxide growth and poly deposition, but before the trenches are closed—and the silicon area is applied. This inline test may be cause high relative cost, especially for cheaper designs.

Embodiments may provide a new more cost-efficient SOX test using a proposed layout structure, which may allow for the SOX test to be performed at a reduced cost in the backend. Embodiments may be used with designs having a center gate pad, but may also be applied to all other kinds of gate pad positions. At least some embodiments may be based on splitting the source pad into several sub-pads, which may be electrically isolated, and use buried trenches, e.g. filled with highly doped polysilicon, to transport potentials of one pad to the trenches, which run below the other pad. A potential difference e.g. between a first sub-pad (e.g. of a first source wiring substructure) and a second sub-pad (e.g. of a second source wiring substructure) may be applied, and defects in source field trenches below the first pad can be detected. This procedure may be repeated for the other pads as well. In some embodiments, no additional pads may be required (compared to other methodologies for SOX backend testing), such that the loss of the active area may be reduced (<1%, or even to below 1% e.g. for 75 A-chips). The separated sub-pads may later be connected, e.g. during bonding in the backend (e.g. a part of the manufacturing, in which metal layers and interconnects are formed and backend testing provided), applying to the corresponding trenches source potential, such that this separation might not affect device performance. Embodiments may be used with an arbitrary number of source sub-pads >1, for example.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a first source wiring substructure connected to a plurality of source doping region portions of a transistor structure; and
a second source wiring substructure connected to a plurality of source field electrodes located in a plurality of source field trenches extending into a semiconductor substrate of the semiconductor device,
wherein a contact wiring portion of the first source wiring substructure and a contact wiring portion of the second source wiring substructure are located at a wiring layer of a layer stack located on the semiconductor substrate,
wherein the contact wiring portion of the first source wiring substructure and the contact wiring portion of the second source wiring substructure each have a lateral size sufficient for a contact for at least a temporary test measurement,
wherein the wiring layer comprising the contact wiring portions is located closer to the semiconductor substrate than any ohmic electrical connection between the first source wiring substructure and the second source wiring substructure.

2. The semiconductor device of claim 1, wherein at least portions of the plurality of source field trenches are located vertically below the contact wiring portion of the first source wiring substructure.

3. The semiconductor device of claim 1, wherein at least portions of the plurality of source doping region portions are located vertically below the contact wiring portion of the first source wiring substructure.

4. The semiconductor device of claim 1, wherein the first source wiring substructure is connected to a second plurality of source field electrodes located in a second plurality of source field trenches extending into the semiconductor substrate of the semiconductor device.

5. The semiconductor device of claim 4, wherein at least portions of the second plurality of source field trenches are located vertically below the contact wiring portion of the second source wiring substructure.

6. The semiconductor device of claim 1, wherein the second source wiring substructure is further connected to a second plurality of source doping region portions of the transistor structure.

7. The semiconductor device of claim 6, wherein at least portions of the second plurality of source doping region portions are located vertically below the contact wiring portion of the second source wiring substructure.

8. The semiconductor device of claim 1, wherein at least a part of the second source wiring substructure located between the plurality of source field electrodes and the contact wiring portion of the second source wiring substructure is implemented by a connection trench electrode located in a connecting trench extending into the semiconductor substrate.

9. The semiconductor device of claim 1, wherein the contact wiring portion of the first source wiring substructure and the contact wiring portion of the second source wiring substructure each have a lateral size larger than 5 μm by 5 μm.

10. The semiconductor device of claim 1, wherein the layer stack comprises a further metal layer located at a larger distance to the semiconductor substrate than the wiring layer comprising the contact wiring portions, and wherein an ohmic electrical connection between the first source wiring substructure and the second source wiring substructure is provided through the further metal layer.

11. The semiconductor device of claim 1, wherein the first source wiring substructure comprises a first source pad structure and the second source wiring substructure comprises a second source pad structure for bonding a wire or attaching a solder structure, and wherein the first source pad structure and the second source pad structure are located closer to the semiconductor substrate than any ohmic electrical connection between the first source wiring substructure and the second source wiring substructure.

12. The semiconductor device of claim 11, wherein a first bond wire is located between the first source pad structure and a package structure and a second bond wire is located between the second source pad structure and the package structure, and wherein an ohmic electrical connection between the first source wiring substructure and the second source wiring substructure is provided through the first bond wire, the second bond wire and the package structure.

13. The semiconductor device of claim 1, further comprising a plurality of body doping region portions of a body region of the transistor structure, wherein the plurality of body doping region portions is connected to the first source wiring substructure, and wherein the plurality of body doping region portions is located adjacent to the source field trenches of the plurality of source field trenches.

14. The semiconductor device of claim 1, further comprising a plurality of gate trenches extending into the semiconductor substrate, wherein the plurality of source doping region portions is located adjacent to the plurality of gate trenches.

15. The semiconductor device of claim 1, wherein the first source wiring substructure is ohmic electrically connected to the second source wiring substructure outside a region located between a back-side surface of the semiconductor substrate and the wiring layer comprising the contact wiring portions.

16. The semiconductor device of claim 1, wherein the second source wiring substructure comprises a lateral wiring portion between the plurality of source field electrodes and the contact wiring portion of the second source wiring substructure.

17. A method for forming a semiconductor device, the method comprising:
   forming a plurality of source field trenches extending into a semiconductor substrate of the semiconductor device;
   forming a plurality of source field electrodes located in the plurality of source field trenches;
   forming a plurality of source doping region portions of a transistor structure; and
   forming a first source wiring substructure connected to the plurality of source doping region portions and a second source wiring substructure connected to the plurality of source field electrodes,
   wherein a contact wiring portion of the first source wiring substructure and a contact wiring portion of the second source wiring substructure are located in a wiring layer of a layer stack located on the semiconductor substrate,
   wherein the contact wiring portion of the first source wiring substructure and the contact wiring portion of the second source wiring substructure each have a lateral size sufficient for a contact for a temporary test measurement,
   wherein the wiring layer comprising the contact wiring portions is located closer to the semiconductor substrate than any ohmic electrical connection between the first source wiring substructure and the second source wiring substructure.

18. The method of claim 17, further comprising:
   testing the semiconductor device by applying a test voltage between the first source wiring substructure and the second source wiring substructure and measuring a leakage current between the first source wiring substructure and the second source wiring substructure caused by the test voltage.

19. The method of claim 18, further comprising:
   forming an ohmic electrical connection between the first source wiring substructure and the second source wiring substructure after measuring the leakage current.

* * * * *